United States Patent
Lichtenstein et al.

(10) Patent No.: US 6,205,364 B1
(45) Date of Patent: Mar. 20, 2001

(54) METHOD AND APPARATUS FOR REGISTRATION CONTROL DURING PROCESSING OF A WORKPIECE PARTICULARLY DURING PRODUCING IMAGES ON SUBSTRATES IN PREPARING PRINTED CIRCUIT BOARDS

(75) Inventors: Yoav Lichtenstein, Raanana; Efraim Miklatzky, Jerusalem; Gadi Terliuc, Raanana, all of (IL)

(73) Assignee: Creo Ltd., Lod (IL)

( * ) Notice: Subject to any disclaimer, the term of this patent is extended or adjusted under 35 U.S.C. 154(b) by 0 days.

(21) Appl. No.: 09/241,433

(22) Filed: Feb. 2, 1999

(51) Int. Cl.[7] .................................................. G05B 19/18
(52) U.S. Cl. ............................................. 700/58; 700/194
(58) Field of Search .................... 430/5, 22, 30; 700/58, 59, 60, 121, 194, 62, 114, 176, 193

(56) References Cited

U.S. PATENT DOCUMENTS

| | | |
|---|---|---|
| 3,646,336 | 2/1972 | Hobrough . |
| 4,790,694 | 12/1988 | Wilent et al. . |
| 4,829,375 | 5/1989 | Alzmann et al. ............... 358/101 |
| 4,999,764 * | 3/1991 | Ainsworth et al. ............. 700/58 |
| 5,036,574 | 8/1991 | Kakimoto . |
| 5,124,927 * | 6/1992 | Hopewell et al. ............. 700/121 |
| 5,136,948 | 8/1992 | Fujino et al. .................. 101/486 |
| 5,164,742 | 11/1992 | Baek et al. ...................... 346/76 |
| 5,200,800 * | 4/1993 | Suda et al. ..................... 356/401 |
| 5,230,027 | 7/1993 | Kikuchi . |
| 5,274,394 | 12/1993 | Corona et al. .................. 346/1.1 |
| 5,381,004 * | 1/1995 | Uritsky et al. ................. 250/307 |
| 5,403,684 | 4/1995 | Schroeder et al. .............. 430/5 |
| 5,453,777 | 9/1995 | Pensavecchia et al. ......... 347/234 |
| 5,459,941 | 10/1995 | Lowe .............................. 33/620 |
| 5,500,801 | 3/1996 | Löffler .......................... 364/469 |
| 5,548,372 | 8/1996 | Schroeder et al. ............. 355/53 |
| 5,682,243 * | 10/1997 | Nishi ............................. 356/401 |
| 5,699,742 | 12/1997 | Ahrens et al. ................. 101/486 |
| 5,754,294 | 5/1998 | Jones et al. . |
| 5,812,407 * | 9/1998 | Sato et al. ..................... 700/193 |
| 5,835,194 | 11/1998 | Morton . |
| 5,920,481 * | 7/1999 | Ichihara et al. ................ 700/121 |
| 5,980,088 * | 11/1999 | Iwasaki et al. ................. 700/166 |
| 5,980,194 * | 11/1999 | Freerks et al. ................. 414/754 |
| 5,985,680 * | 11/1999 | Singhal et al. .................. 438/7 |
| 6,043,865 * | 3/2000 | Halup et al. ................... 355/75 |

* cited by examiner

*Primary Examiner*—Paul P. Gordon
*Assistant Examiner*—Zoila Cabrera
(74) *Attorney, Agent, or Firm*—Benjamin J. Barish

(57) ABSTRACT

A method and apparatus for controlling a processing machine to perform a processing operation on a workpiece by (a) determining the nominal locations of at least two sensible reference marks on the workpiece in terms of the coordinates of the workpiece; (b) loading the workpiece on the processing machine; (c) sensing, and measuring the actual locations of, the reference marks on the workpiece when so mounted, in terms of the coordinates of the processing machine; (d) determining at least one geometrical transformation needed to transform the workpiece coordinates of the nominal locations of the reference marks to the processing machine coordinates of the actual locations of the reference marks; (e) and controlling the processing machine in accordance with the determined geometrical transformation.

48 Claims, 16 Drawing Sheets

METHOD AND APPARATUS FOR REGISTRATION CONTROL DURING PROCESSING OF A WORKPIECE PARTICULARLY DURING PRODUCING IMAGES ON SUBSTRATES IN PREPARING PRINTED CIRCUIT BOARDS

FIELD AND BACKGROUND OF THE INVENTION

The present invention relates to a method and apparatus for registration control during the processing of workpieces. The invention is particularly useful in registration control during the production of images or other process performed with respect to printed circuit boards (PCBs) or other substrates, and is therefore described below with respect to such an application.

Registration control is important in many processing operations to be performed on workpieces. It is particularly important in processing operations requiring the precise matching of a film or an electronic image (i.e., the electronic representation of an image) to a given substrate. Examples of the latter processing operations include contact printing of patterns in multi-layer PCBs, manufacturing of integrated circuits in microelectronics, and plotting of pre-press tooling panels. For example, manufacturing multi-layer PCBs involves the fabrication, and then the stacking, of up to 20 or 30 layers, in which each layer (commonly referred to as an inner layer) has its own previously generated conductor or other (e.g., through holes) pattern.

Manufacturing such multi-layer PCBs encounters a number of registration problems, particularly the following: (1) registration of the image of each layer with respect to those in the other layers; (2) registration of an image on one side of a layer with respect to an image on the other side of the layer; (3) registration of the image plotted on each side of the layer with respect to other tasks involved in processing the layer or the board, such as outer-layer processes, drilling holes, etc.; and (4) registration of the image on each side of the layer with respect to existing pre-drilled holes through the layer. These registration problems become increasingly more difficult to overcome as the component-density of the boards, wafers, or other workpieces increases, the number of layers increases, and/or the size of the workpiece decreases.

Various techniques for overcoming these types of registration problems are described in U.S. Pat. Nos. 4,829,375, 5,136,948, 5,164,742, 5,274,394, 5,403,684, 5,453,777, 5,459,941, 5,500,801, 5,548,372, and 5,699,742.

Most of the known techniques generally involve reorienting the substrate with respect to the machine, and then plotting the image from the image file. However, such known techniques have a number of drawbacks, particularly when plotting on PCBs or other substrates under conditions producing variations in thickness in the layer, or variations in thickness or in length among a series of layers. For instance, when a substrate having significant thickness is mounted on a cylindrical drum which is rotated with respect to the printing or plotting elements, the outer surface of the substrate is under tension thereby increasing its length, whereas the inner surface of the substrate is under compression thereby decreasing its length. An image plotted from an image file on the tensioned outer surface of the loaded layer will shrink when the layer is unloaded; whereas an image plotted on the compressed inner surface will expand when the layer is unloaded. These effects produce scaling changes between the plotted image relative to the image file. These scaling changes, which depend on the thickness of the layer and the loading conditions, introduce registration problems when printing images from individual image files on a plurality of overlying layers or on the opposite faces of the layers.

Another registration problem is encountered when imaging two sides of a layer, one after the other in the plotting machines which can not plot the two sides of the layer simultaneously. This problem is present with respect to both rotary-drum and flat-bed imaging or plotting machines.

A still further registration problem is introduced by dimensional changes of the substrate during processing. For example, temperature variations during processing induce thermal expansion or contraction of the substrate. Thus, thermal changes during the processing of different layers produce dimensional changes which generate registration errors when the layers are stacked to produce the multiple-layer PCB. Dimensional changes are also introduced by mechanical deformation of the layers during processing (e.g., mechanical pre-cleaning), deformation due to stress release (e.g., due to heating in the resist-coating step or due to laminate deformation after copper etching), etc. These registration problems become much more difficult to overcome when the dimensional changes are local and therefore not correctable by a global compensation.

OBJECT AND BRIEF SUMMARY OF THE INVENTION

An object of the present invention is to provide a method and apparatus for controlling a processing operation to be performed on a workpiece, particularly an imaging or printing operation to be performed on a PCB inner layer or other substrate, which method and apparatus particularly address some or all of the foregoing registration problems.

According to one aspect of the present invention, there is provided a method of controlling a processing machine to perform a processing operation on a workpiece, comprising: (a) determining the nominal locations of at least two sensible reference marks on the workpiece in terms of the coordinates of the workpiece; (b) loading the workpiece on the processing machine; (c) sensing, and measuring the actual locations of, the reference marks on the workpiece, when so mounted, in terms of the coordinates of the processing machine; (d) determining at least one geometrical transformation needed to transform the workpiece coordinates of the nominal locations of the reference marks to the processing machine coordinates of the actual locations of the reference marks; and (e) controlling the processing machine in accordance with the determined geometrical transformation.

It will thus be seen that the method as set forth above does not re-orient the workpiece with respect to the processing machine, as in some of the prior art techniques describe in some of the above-cited patents, but rather changes the workpiece coordinates to the processing machine coordinates after the workpiece has been mounted on the processing machine, and thereby compensates for changes in the workpiece, such as changes in the length or in the mounting position of the workpiece, when mounted on the processing machine.

According to further features in the preferred embodiments of the invention described below, the actual location of each of the workpiece reference marks is determined in step (c) by; fixing a sensing device to the processing machine for sensing the workpiece reference marks, with a reference point of the sensing device being at a known location with respect to a reference point of the machine; and vectorially adding the line vector from the machine reference point to the sensing device reference point, and the line vector from the sensing device reference point to the respective workpiece reference point.

More particularly, in the described preferred embodiment, the actual location of each of the workpiece reference marks is measured in step (c) by: (i) fixing a camera to the processing machine such that a reference point of the camera field of view is at a known location with respect to a reference point of the machine; (ii) actuating the camera to view a portion of the workpiece which includes the respective workpiece reference mark; (iii) measuring the location of a reference point on the respective workpiece reference mark in the camera field of view, relative to the camera field reference point; (iv) and vectorially adding the line vector from the machine reference point to the camera field reference point, and the line vector from the camera field reference point to the respective workpiece reference point to thereby determine the location of the respective workpiece reference point relative to the machine reference point.

According to another aspect of the invention, there is provided a method of controlling the plotting head of an imaging machine for producing an image on a substrate according to an image file, comprising: (a) determining the nominal locations of at least two sensible reference marks on the substrate in terms of the coordinates of the substrate; (b) loading the substrate on the imaging machine having a plotting head; (c) sensing, and measuring the actual locations of, the reference marks on the mounted substrate in terms of the coordinates of the imaging machine; (d) determining at least one geometrical transformation needed to transform the substrate coordinates of the nominal locations of the reference marks to the imaging machine coordinates of the sensed locations of the reference marks; (e) and controlling the plotting head to produce an image on the substrate in accordance with the determined geometrical transformation.

According to yet another aspect of the present invention, there is provided a method of processing a substrate comprising: (a) performing a first processing operation on the substrate; (b) mounting the substrate on a processing machine to perform a secong processing operation thereon; (c) sensing the actual locations of preselected features on the substrate produced by the first processing operation; (d) and controlling the second processing operation in accordance with the sensed features.

According to further features of this aspect of the invention in the preferred embodiment described below, steps (c) and (d) are performed by: (i) determining, before step (b), the nominal locations of at least one reference feature on the substrate in terms of the coordinate of the substrate; (ii) after step (b), sensing, and measuring the location of, the reference feature in terms of the coordinates of the machine to perform the second operation on the substrate; (iii) determining at least one geometrical transformation needed to transform the substrate coordinates of the nominal location of the reference feature to the machine coordinates of the sensed location of the reference feature; and (iv) controlling the second processing operation in accordance with the determined geometrical transformation.

As will be described more particularly below, the second processing operation is thus controlled by the actual location of features on the substrate produced during the first processing operation, and thereby corrects any errors produced during the first operation performed on the substrate.

For example, the first operation may be drilling holes in accordance with a drilling file in a PCB inner layer; and the second processing operation may be printing a conductor image from a conductor pattern file, in which conductor pads are to coincide with drilled holes to enable the proper connections to be made to the conductor patterns in the various inner layers, e.g., by passing conductor pins through the holes. Thus, the printing operation is controlled by adjustment of the printing elements according to the actual location of some or all of the drilled holes in a way to bring the conductor pads to their proper positions relative to the drilled holes, thus eliminating misregistration between holes and pads. The same technique may be applied to correct misregistration between holes and pads where the pads are produced during the first processing operation, and the holes are to be produced during the second processing operation based on the sensed actual locations of the pads.

According to a still further aspect of the present invention, there is provided a method of controlling an imaging operation performed by a plotting head on the surface of a substrate having thickness, comprising: continuously measuring the thickness of the substrate; and continuously controlling the plotting head and the electronic image to compensate for variations in the thickness of the substrate.

According to a still further aspect of the invention, there is provided apparatus for controlling a processing operation on a workpiece carrying sensible reference marks at nominal locations on the workpiece in terms of the coordinates of the workpiece, comprising: a mounting device for mounting the workpiece to the apparatus; a processing head movable with respect to a workpiece when mounted on the mounting device; a sensing device carried by the processing head so as to move therewith with respect to a mounted workpiece, the sensing device being capable of sensing the workpiece reference marks and having a reference point which is at a known location with respect to a reference point on the processing head; and a data processor system processing the output of the sensing device for: (a) determining the locations of the reference marks on the workpiece in terms of the coordinates of the processing head; (b) determining the geometrical transformations needed to transform the workpiece coordinates of the nominal locations of the reference marks to the processing head coordinates of the sensed locations of the reference marks; and (c) controlling the processing operation in accordance with at least one of the geometrical transformations.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

As will be described more particularly below, the invention is generally useful for controlling a processing operation to be performed on a workpiece in order to eliminate or reduce certain registration errors, particularly those arising when the workpiece is mounted on the processing machine. The invention is specially useful for reducing or eliminating registration errors when plotting or printing an image on a substrate, such as an inner layer of a printed circuit board, mounted on the external (or internal) surface of a rotary-drum or flat-bed imaging machine; and therefore the invention is described below with respect to this particular application.

FIGS. 1–5 illustrate one form of imaging machine of this type, namely a laser direct imaging (LDI) machine which plots (or prints) separate images from separate files on both sides of an inner layer of a PCB (printed circuit board), similar to the pre-press imaging apparatus manufactured by Creo Products Inc, of Canada. Such machines can handle one layer at a time, or two layers simultaneously. The one or two layers are manually or automatically loaded on the machine with one side facing upwardly, whereupon the machine plots the file suitable for that side on the one or two layers. The layers are then manually or automatically inverted such that the other side faces upwardly, whereupon the machine plots the file suitable for the second side. After both sides have thus been printed, the layers are unloaded.

The method and apparatus described below enable achieving the following two major objectives: (1) to plot the image on each side of the layer in a correct geometry such that the resulting image will resemble the file upon which it was created in respect of geometrical shape and scale, irrespective of variation in the thickness or the length of the layer, or the alignment of the layer with respect to the machine; and (2) to plot the images on the two sides of the layer such that they will register with each other.

Figure 1:
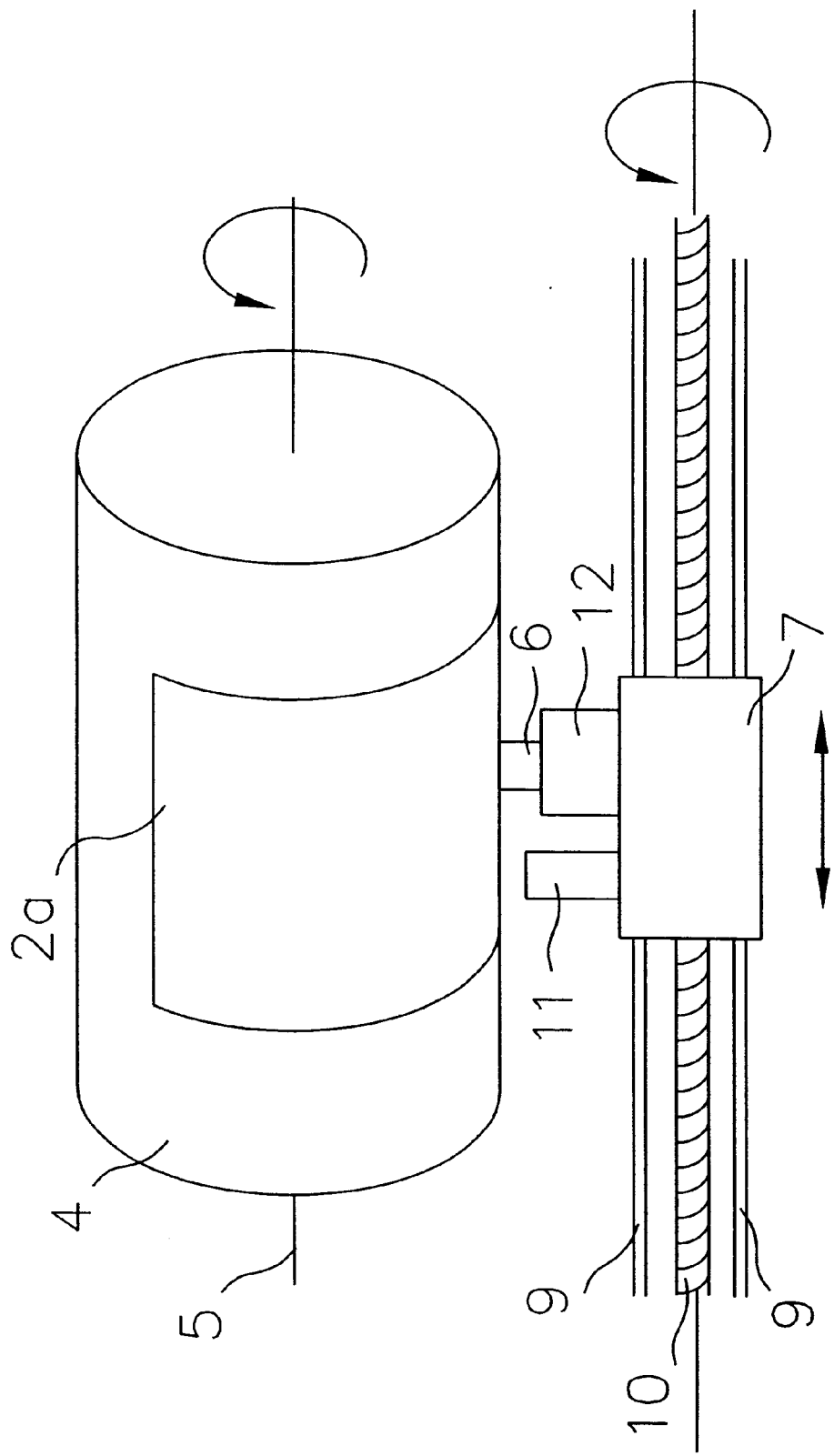
FIG. 1 is a top view schematically illustrating one form of processing apparatus, namely an imaging or plotting machine, constructed in accordance with the present invention.
Figure 2:
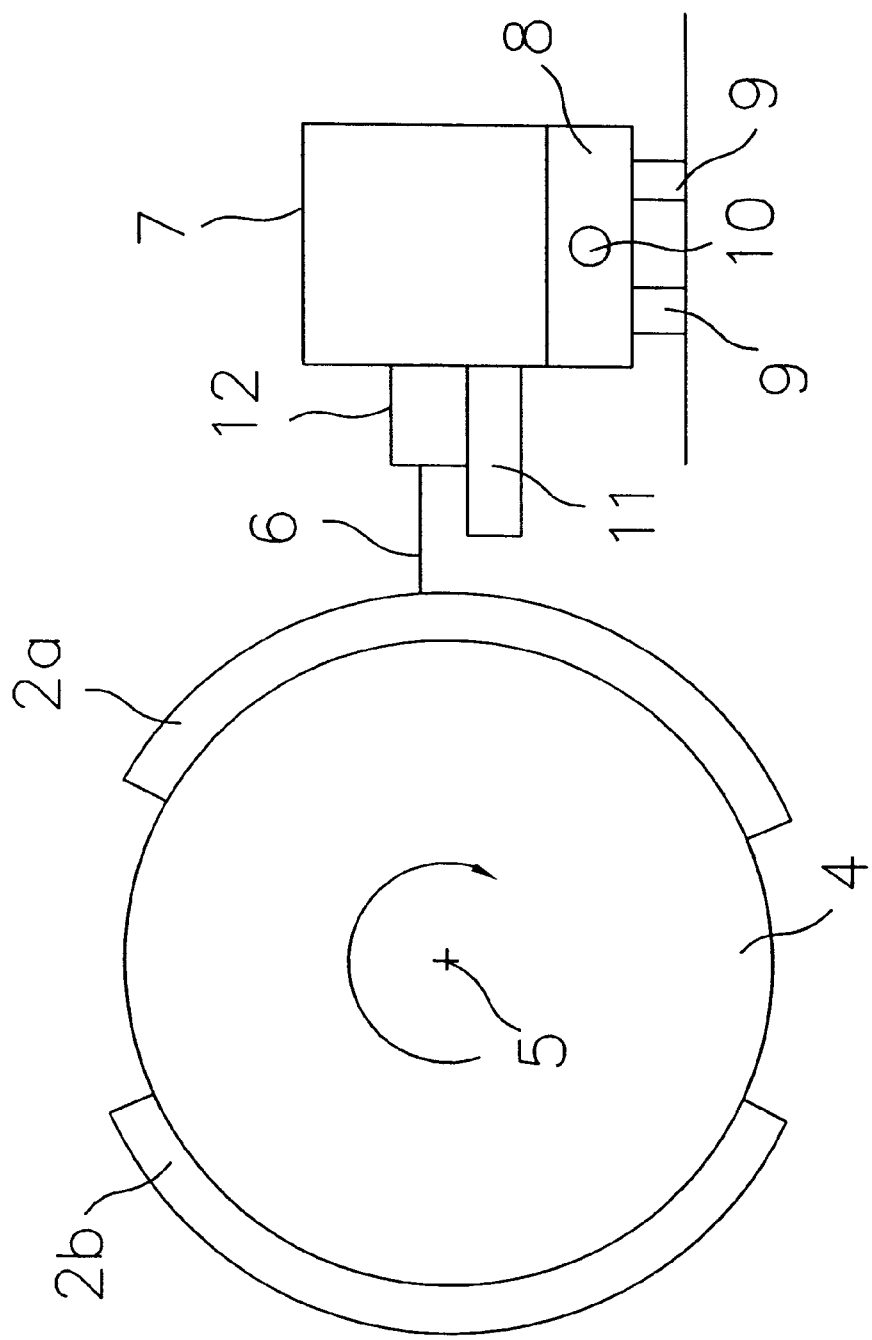
FIG. 2 is a side view of the apparatus of FIG. 1.
Figure 3:
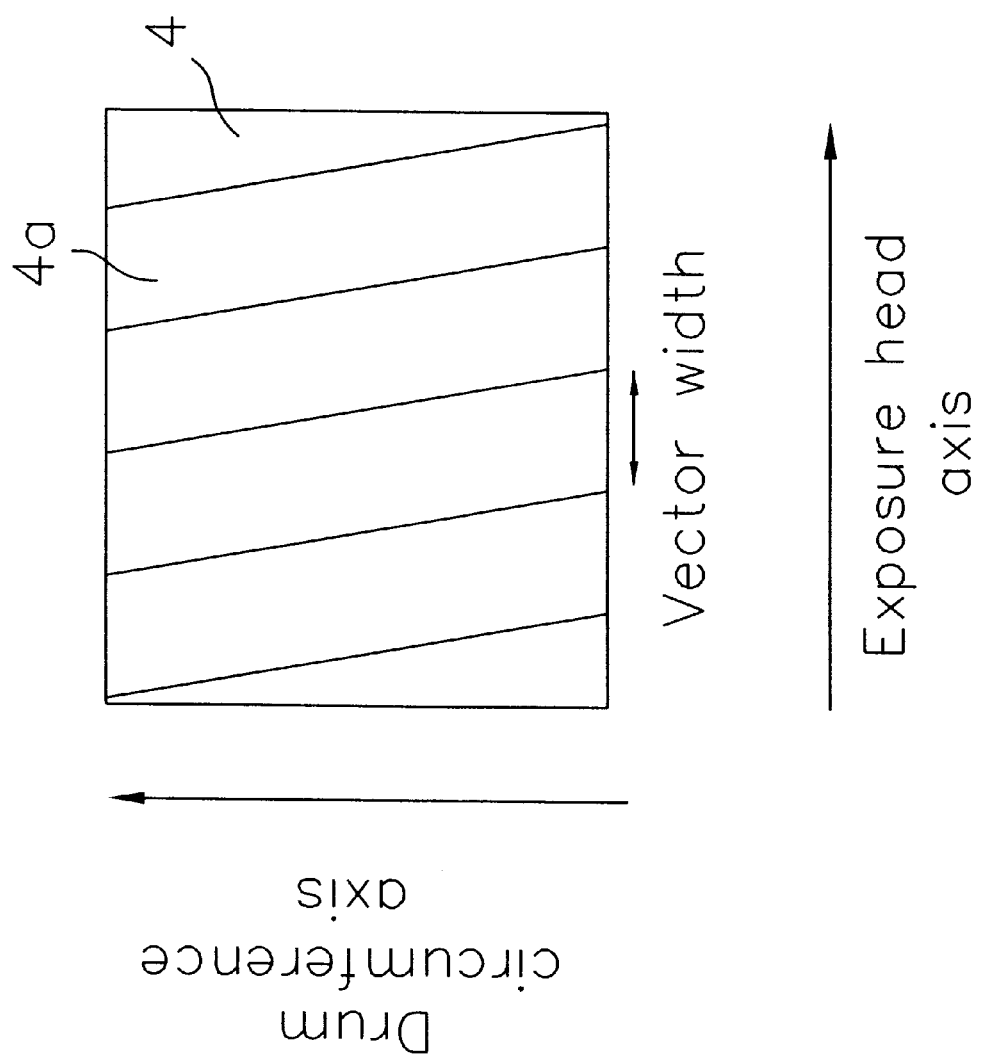
FIG. 3 illustrates the area scanning pattern in the apparatus of FIGS. 1 and 2.

FIGS. 1 and 2 illustrate two such layers 2a, 2b, mounted in any conventional manner on a cylindrical drum 4 rotatable about a rotary axis 5. Each layer 2a, 2b, has a resist-coated outer surface to be exposed to the laser beams produced by a linear array of lasers 6 carried by a plotting or printing exposure head 7. Each laser defines a pixel of the image to be printed on the layers 2a, 2b, and is on-off controlled according to the respective image file.

The exposure head 7 is mounted on a flat carriage 8 which moves along tracks 9, by rotating screw 10, parallel to the rotary axis 5 of the drum 4. The lasers 6 are arranged in a linear array also parallel to the drum rotary axis 5, such that the rotation of the drum, and the linear movement of the exposure head 7, cause the laser beams to scan the complete area of each layer 2a, 2b, in the form of parallel inclined bands as shown at 4a in FIG. 3.

A sensing device, in the form of an electronic camera 11, is fixed to the exposure head 7 so that it moves with the exposure head. Camera 11 has a field of view which covers only a relatively small portion of the surface of the layers 2a, 2b in order to provide high resolution in a relatively compact camera. The camera is fixed to the exposure head 7 such that a reference point of the camera field of view is at a known location with respect to a reference point of the exposure head 7, and thereby of the lasers 6 producing the laser writing beams. As will be described more particularly below, the camera is used to snap features on the panel in order to sense reference marks thereon, and thereby to determine the locations of such reference marks in terms of the machine exposure head coordinates.

Exposure head 7 further carries an autofocus device 12. This device measures the distance between the exposure head and the outer surface of the layer, by means well known in the art, in order to keep the printing laser beams in focus with the layer outer surface. However, as will also be described more particularly below, autofocus device 12 is also used, according to another aspect of the present invention, for continuously measuring the thickness of the layer 2a, 2b, and for continuously controlling the lasers 6 to compensate for geometrical distortions resulting from variations in layer thickness.

Figure 4:
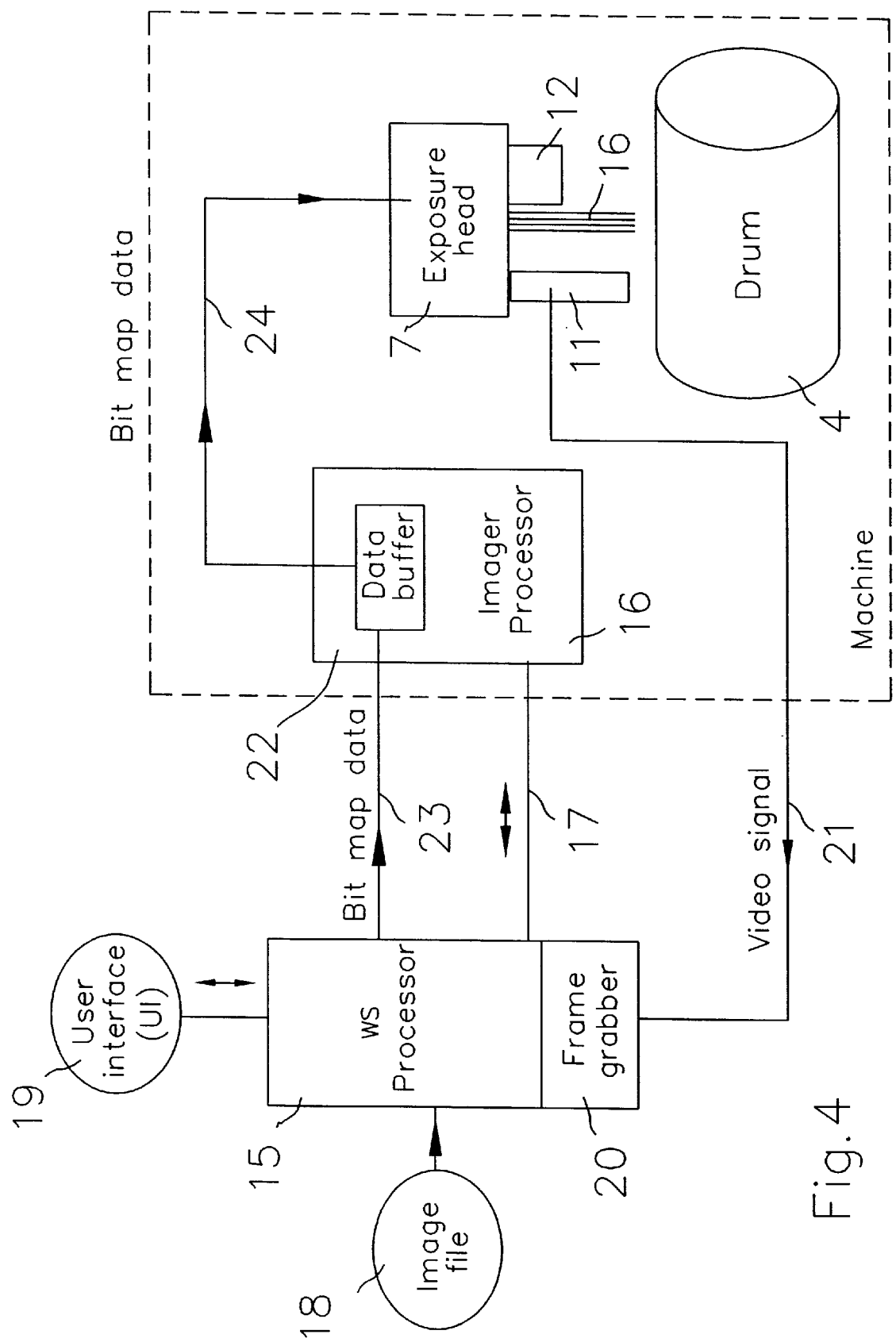
FIG. 4 schematically illustrates the electrical system for controlling the apparatus of FIGS. 1 and 2.

As shown in FIG. 4, the electrical system includes two main processing units: a workstation (WS) processor 15 located in the workstation outside of the imager; and an imager processor 16 located on the imager. The two processors communicate with each other via a two-directional path 17.

Figure 5:
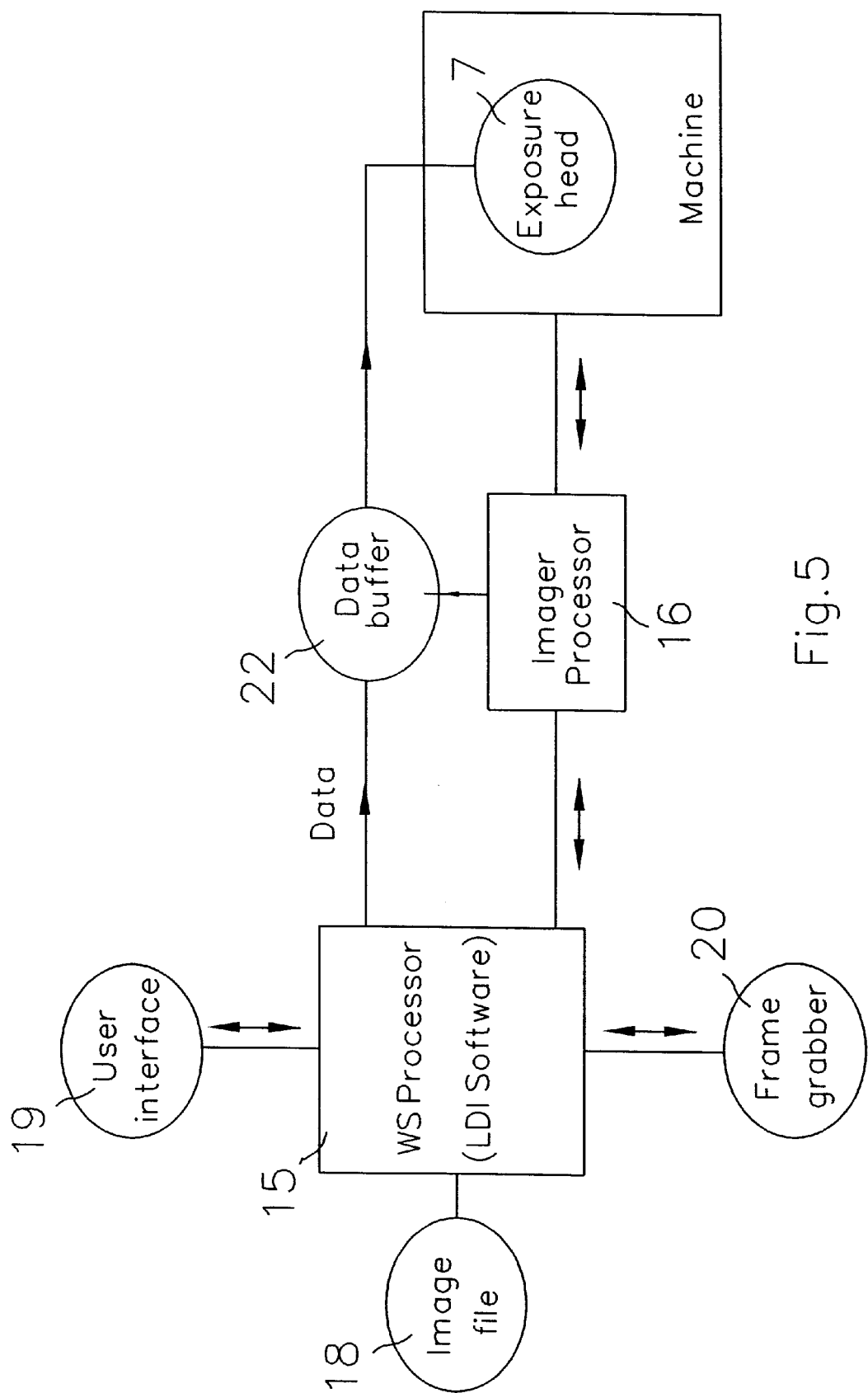
FIG. 5 is a block diagram illustrating the data flow in the apparatus of FIG. 4.

WS processor 15 is the main control unit. As shown in FIGS. 4 and 5, WS processor 15 receives inputs from the image file 18 and the user interface 19, and controls the lasers 6 and the camera 11 carried by the exposure head 7 in accordance with these inputs. A frame grabber 20 within the WS processor 15 grabs the video signal frame from camera 11 received via line 21, and converts it to a graphic file.

As will be described more particularly below, the WS processor 15 identifies certain features in the grabbed frame, and calculates the geometrical corrections that are to be applied on the electronic image (i.e., the electronic representation of the image) from the image file 18. These corrections are sent to the imager processor 16, which performs the appropriate electronic and data manipulations on the electronic image to correct for misregistration in the layers 2a, 2b.

The imager processor 16 includes a data buffer 22 which receives the data from the WS processor 15. A graphic file of a given format is converted in the WS processor 15 to a bit-map file, and is sent through a dedicated path 23 to the data buffer 22 of the imager processor 16. Data is sent from a suitable location in data buffer 22 via path 24 to the exposure head 7 to control the plotting lasers 6.

As shown particularly in FIG. 5, the workstation (WS) operations are governed by the LDI (Laser Direct Imaging) software within the WS processor 15; and the actions of the lasers 6 carried by the exposure head 7 are governed by the imager processor 16, which processor also receives feedback from the exposure head.

Figure 10:
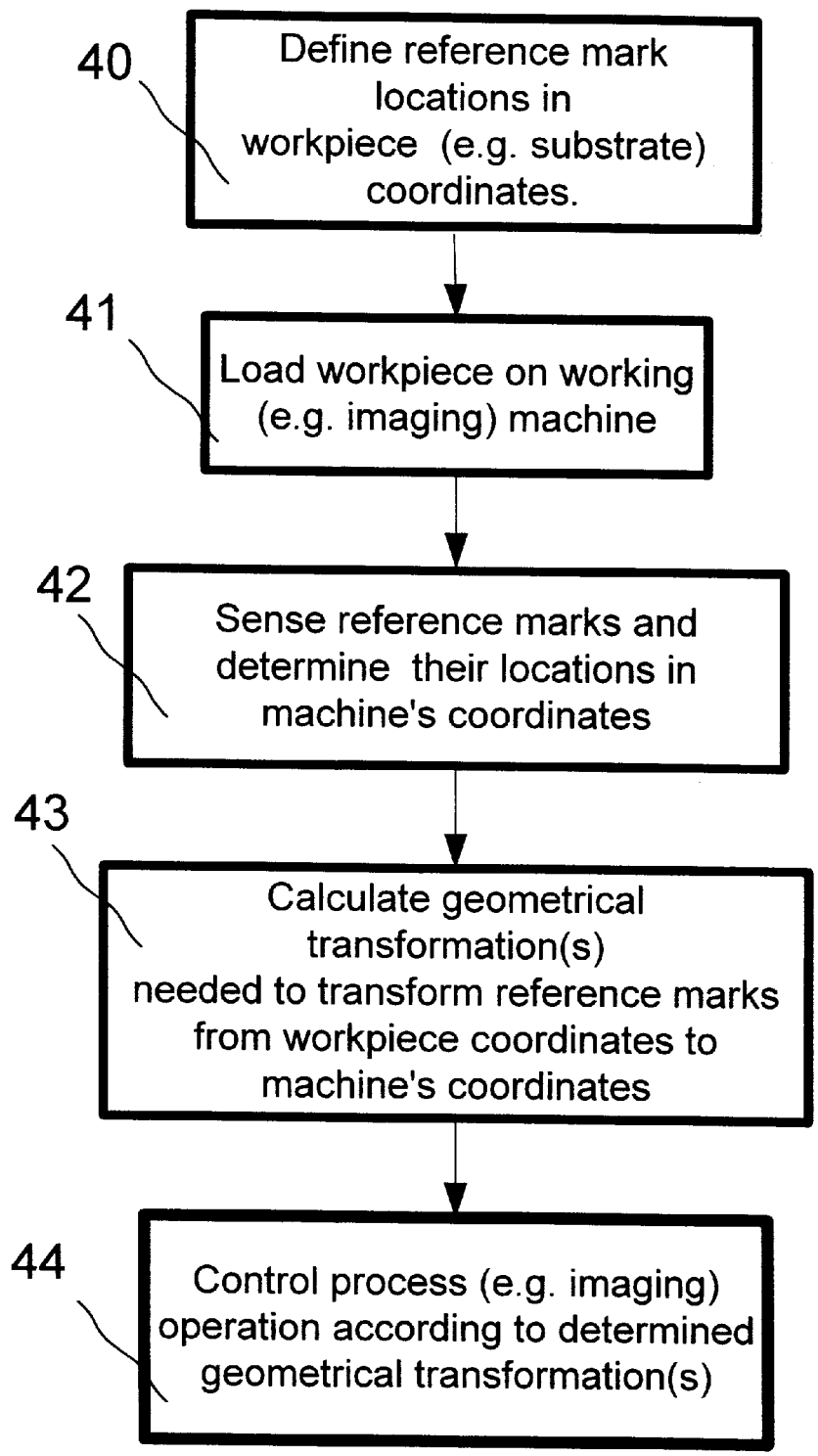
FIG. 10 is a flow chart illustrating one manner of using the described apparatus for reducing or eliminating registration errors.

According to one aspect of the present invention, registration problems arising by changes in thickness and in length of the layer when mounted on the imager (e.g., rotary drum 4) are eliminated or reduced by converting the workpiece coordinates of the image file 18 to the machine coordinates of the exposure head 7 and the drum 4 of the plotting machine. Briefly, this is done in the manner described in the flow chart of FIG. 10, by controlling the plotting elements (lasers 6) for plotting the image on the outer surfaces of the layers 2a, 2b in the following steps:

(a) determining the nominal location of at least two sensible reference marks on each substrate (layers 2a, 2b) in terms of the coordinates of the substrate (block 40, FIG. 10);

(b) loading the substrate (layers 2a, 2b) on the rotatable drum 4 of the imaging machine (block 41);

(c) sensing the reference marks and measuring their locations in terms of the coordinates of the imaging machine (block 42);

(d) determining the geometrical transformations needed to transform the substrate coordinates of the nominal locations of the reference marks to the imaging machine coordinates of the sensed locations of the reference marks (block 43);

(e) and controlling the array of lasers when plotting on the substrate (layers 2a, 2b) in accordance with the at least one geometrical transformation (block 44).

Such a method is to be contrasted to presently known aligning methods described in some of the above-cited prior patents, which known methods generally use features on the substrate (pre-punched holes, fiducial marks, etc.) to physically orient or re-orient the substrate to fit the machine coordinates. In the present invention, however, the substrate is not physically re-oriented, but rather the data flow of the data representing the electronic image is controlled to fit the machine coordinates.

Figure 6:
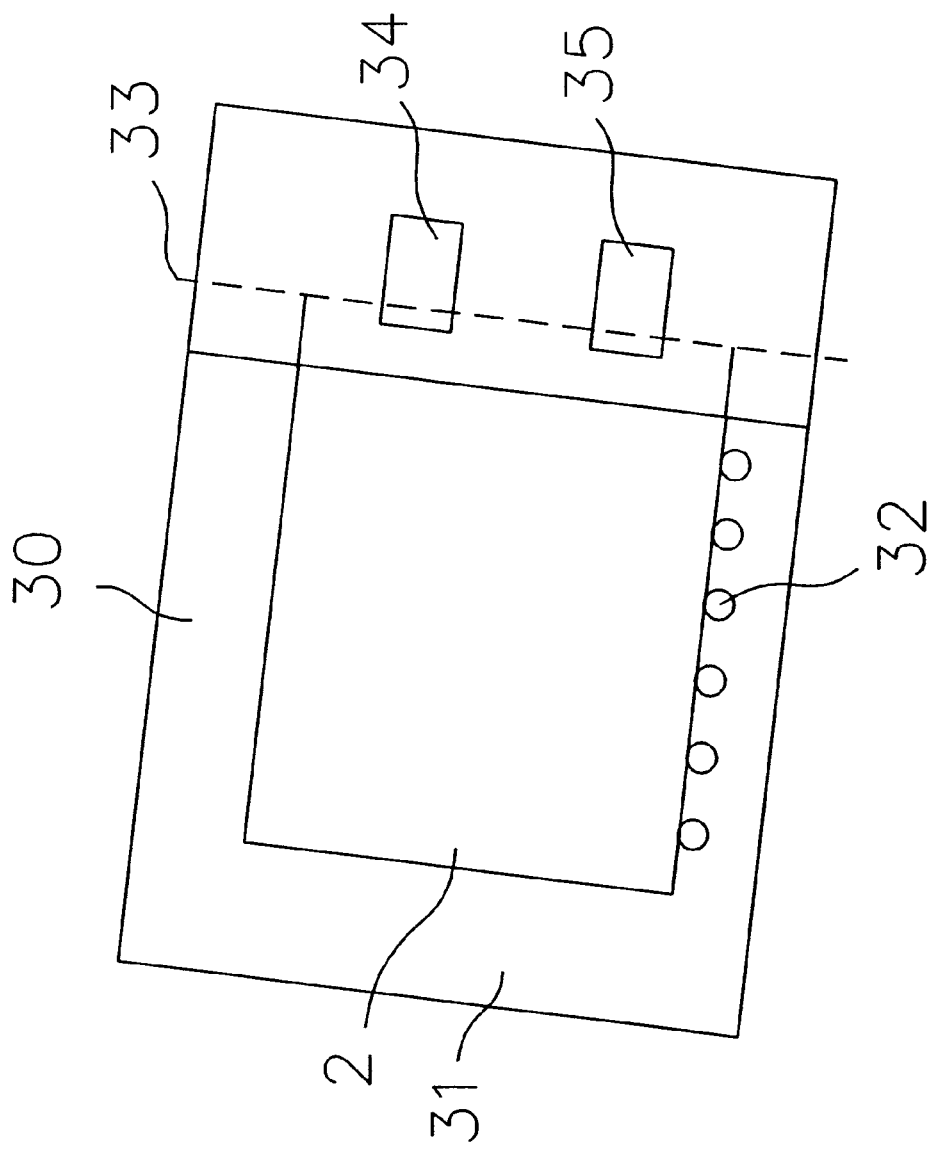
FIG. 6 illustrates one form of a device for producing reference marks on the substrate (workpiece) before being applied to the apparatus of FIGS. 1–5.
Figure 7:
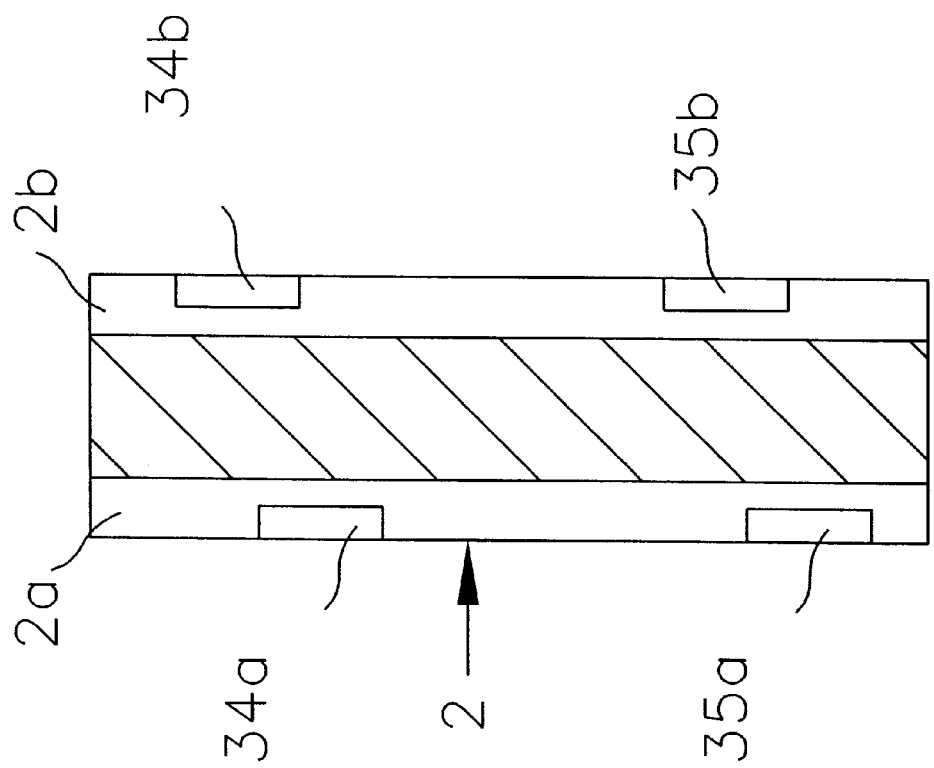
FIGS. 7 and 8 are end and front views, respectively, illustrating the reference marks after application to the substrate by the device of FIG. 6.
Figure 8:
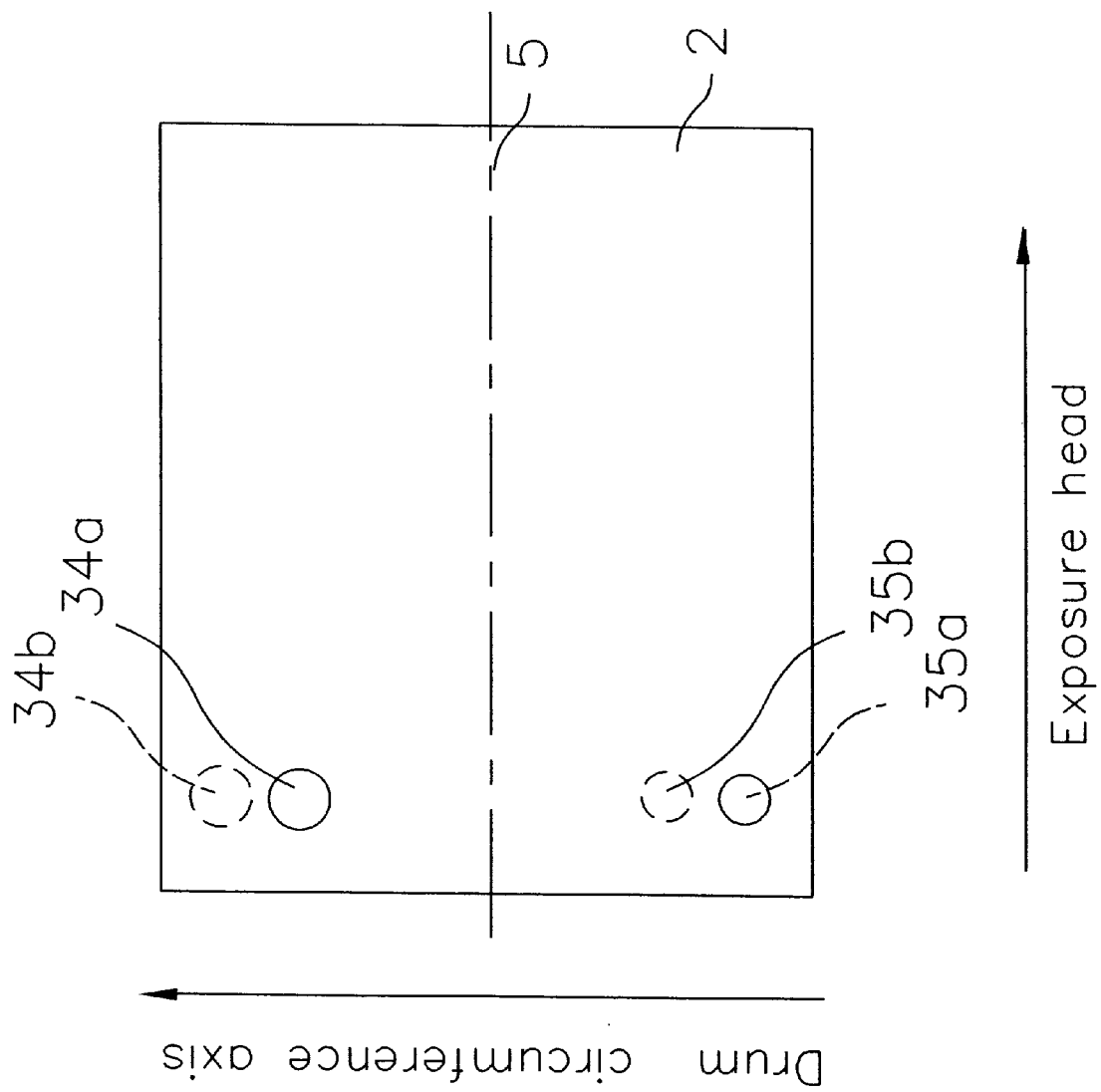

FIGS. 6–8 illustrate one manner of determining the nominal locations of at least two sensible reference marks on the substrate in terms of the coordinates of the substrate. This may be done by a marking device, generally designated 30, including a table 31 having supporting surface (e.g., defined by a plurality of rollers 32 or by a sildable surface) for receiving the substrate 2 and for enabling it to move along the table. The table further includes a stop, schematically indicated at 33, for stopping the substrate at a predetermined position on the table. A marking implement carries two marking elements 34, 35 on each side at predetermined locations with respect to stop 33, so as to apply reference marks to both sides of the substrate 2 when in the predetermined position determined by stop 33.

All four reference marks are applied simultaneously, two (34a, 35a) on one side (2a, FIG. 7) of the substrate, and the other two (34b, 35b) on the other side 2b. This assures extreme accuracy of the positioning of the reference marks relative to each other, rather than relative to the substrate edges, since these reference marks are used for registration purposes rather than the substrate edges.

Table 31 of marking device 30 is preferably made of a material having thermal expansion parameters close to those of the substrate (layers 2a, 2b) in order to minimize temperature effects and to provide high repeatability.

Figure 9:
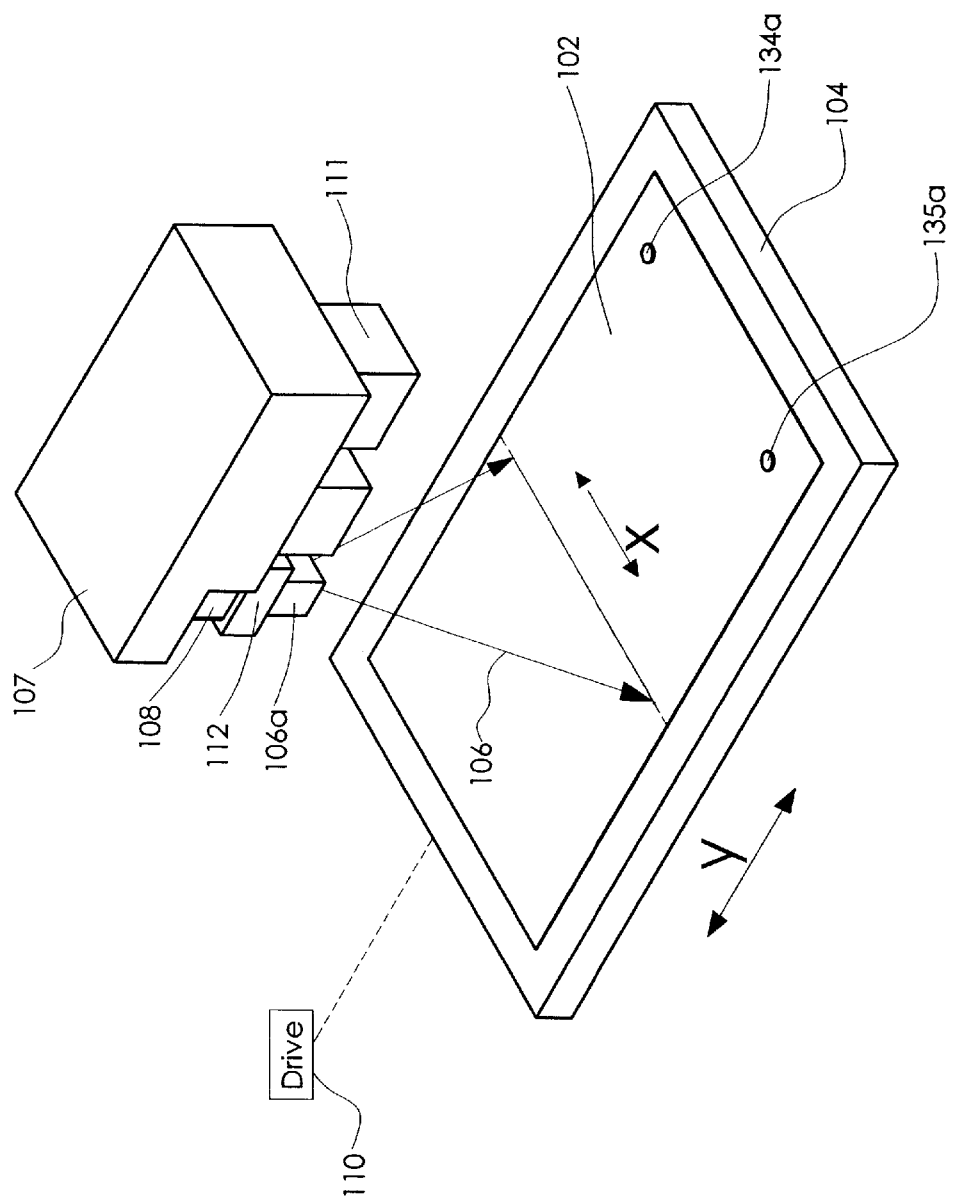
FIG. 9 illustrates the method applied to a flat-bed imaging or printing machine for reducing or eliminating registration errors in accordance with the present invention.

FIG. 9 illustrates a second form of imaging machine of the type including a flat-bed 104 for receiving the substrate layer 102 on which an image is to be plotted by one or more lasers of a laser unit 106a carried by a plotting or exposure head 107. In this example, the flat-bed 104 is driven by a drive 110 along the Y-axis, and the laser beam 106 is deflected along the X-axis by a rotatable polygon and mirror asssembly 108. The exposure head 107 also carries a camera 111 and an autofocus device 112, corresponding to camera 11 and autofocus device 12 in FIGS. 1 and 2.

The machine illustrated in FIG. 9 is otherwise the same as the rotary-drum machine described above, in which the laser 106 is to be controlled to plot an image on both faces of layer 102. Accordingly, layer 102 would be marked with the two reference marks 134a, 135a on one face, with the other two reference marks (not shown) on the opposite face, corresponding to the four reference marks applied to layer 2 as illustrated in FIGS. 7 and 8.

Operation

Figure 11:
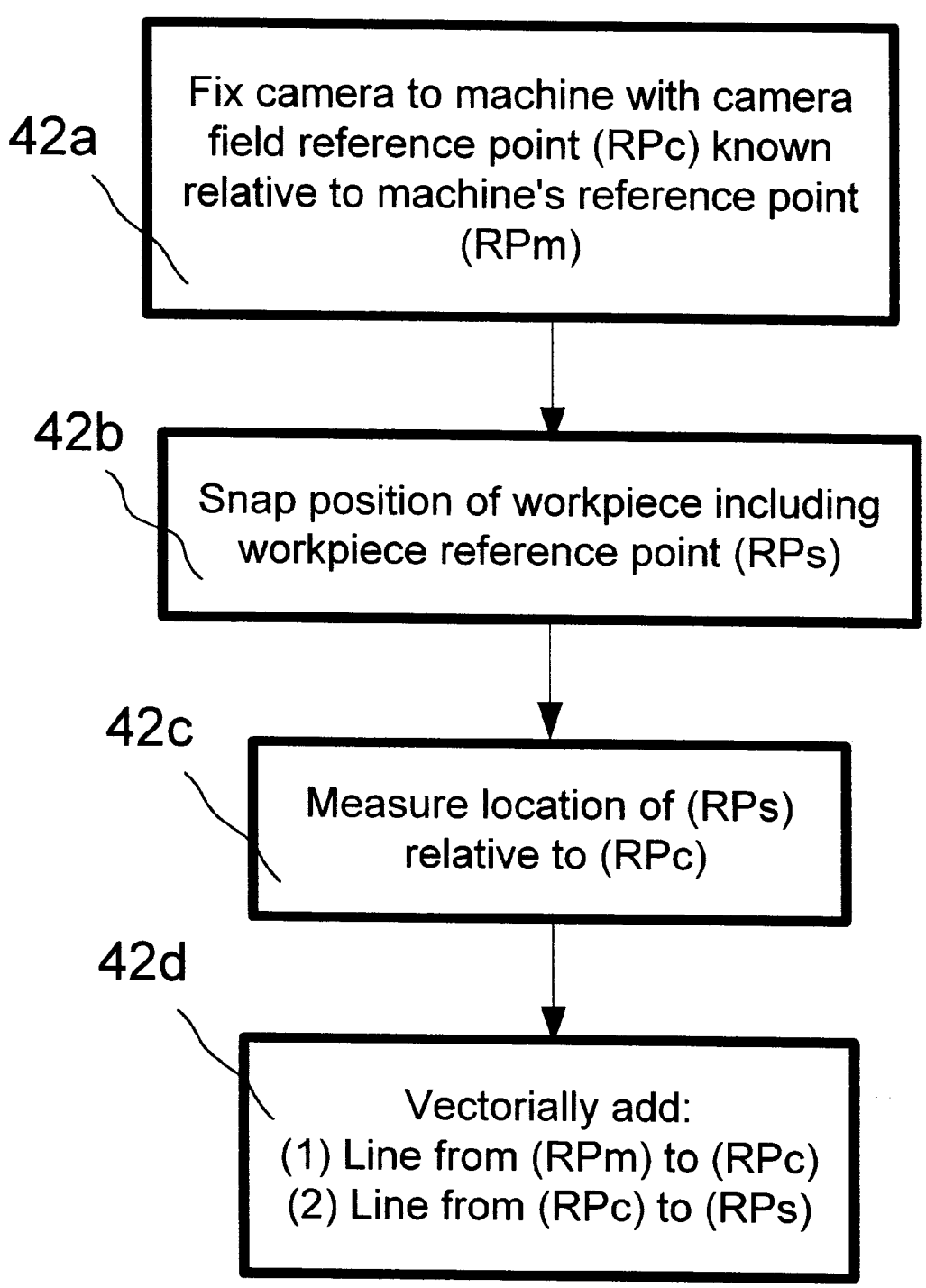
FIG. 11 is a flow chart more particularly illustrating one of the steps in the flow chart of FIG. 9.

The flow charts of FIGS. 10 and 11 illustrate one manner of operating either of the above-described machines for purposes of reducing or eliminating misregistration of images, particularly those arising from variations in the thickness, length or loading orientation of the substrate layer (2 or 102) when loaded on the rotary-drum 4 of the imaging machine illustrated in FIGS. 1–5, or on the flat-bed 104 of the imaging machine illustrated in FIG. 9.

Before the substrate is loaded onto the machine, a determination is made of the locations in workpiece coordinates of at least two reference marks on the substrate. This may be done by using the marking device illustrated in FIGS. 6–8 to apply the two reference marks (e.g., 34a, 35a) on one face of the substrate, and two other reference marks (e.g., 34b, 35b) on the other face. The two reference marks may be of circular configuration each defined by a reference point therein (e.g., the center of the circle) whose position is precisely known in the substrate coordinates, e.g., in the coordinates of the image file.

Rather than specially making these reference marks, existing features on the substrate having precisely known locations in the substrate coordinates may also be used as reference marks for this purpose. For example, the substrate coordinates of such previously existing marks may be their coordinates in a file created in a previous processing step.

The substrate is loaded onto the drum 4 of the machine illustrated in FIGS. 1 and 2 (block 41, FIG. 10), or onto the flat-bed 104 of the machine illustrated in FIG. 9, with one side facing outwardly for plotting thereon. Reference marks 34a, 35a (or 134a, 135a) will thus be exposed.

The next step is to sense each reference mark on the substrate and to determine its location in machine coordinates (block 42). This is done by using the camera 11 (or camera 111) according to the procedure described in the flow chart of FIG. 11.

Figure 12:
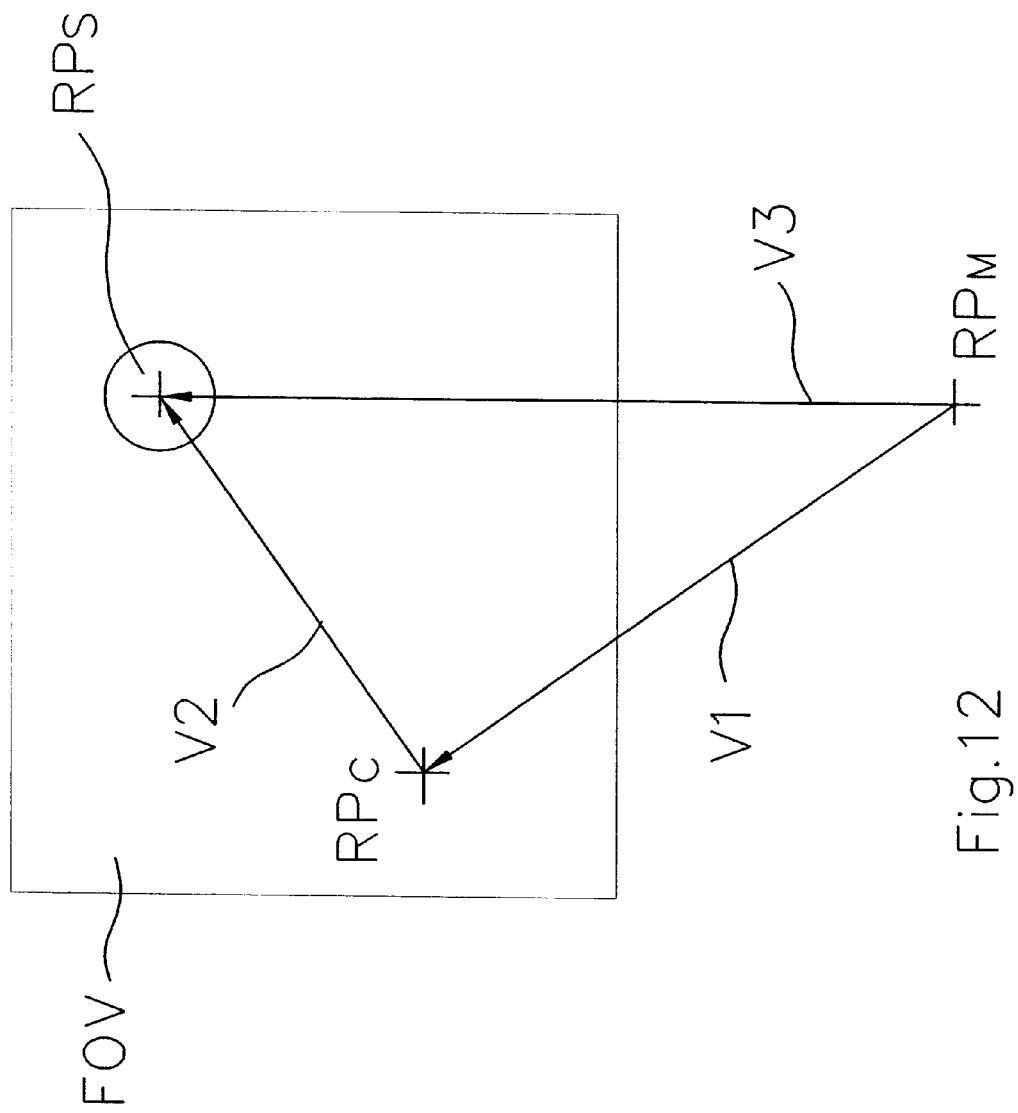
FIG. 12 is a diagram helpful in understanding the flow charts of FIGS. 10 and 11.

Thus, as shown in FIGS. 11 and 12, camera 11 (or camera 111) is fixed to the exposure head 7 (or 107) of the plotting machine such that a camera reference point ($RP_C$, FIG. 12), e.g., the center point of the camera field of view (FOV), is at a known location with respect to a machine reference point ($RP_M$) of the exposure head 7 (or 107) on which the camera is fixed.

The exposure head 7 (or 107), and the camera 11 (or 111) fixed to it, are then moved to a "snap" position of the camera, wherein one of the two substrate (workpiece) reference points ($RP_S$), e.g., 34a, is within the field of view of the camera. This position is snapped by frame grabber 20, and the frame is converted to a graphic file (block 42b). Processor 15 then measures the location of the substrate (workpiece) reference point $RP_S$ relative to the camera field reference point $RP_C$ (block 42c), and then vectorially adds the line vector from the machine reference point $RP_M$ to the workpiece reference point $RP_S$, and the line vector from the camera field reference point $RP_C$ to the workpiece reference point $RP_S$ (block 42d). This vectorial addition determines the exact location of the reference mark (e.g., 34a) in machine coordinates.

In this example, the reference mark 34 is shown as of a circular configuration, with the reference point thereof being in the center; it will be appreciated, however, that other configurations of reference marks may be used (e.g., square configuration), and that other points thereof (e.g., a corner) could be considered as the reference point of the reference mark.

It will be seen, from FIG. 12, that vector line $V_1$, connecting the machine reference point $RP_M$ with the camera field reference point $RP_C$, is known beforehand; that vector line $V_2$, connecting the camera field reference point $RP_C$ with the workpiece reference point $RP_S$, is measured by operation 42c of FIG. 11; and that vector line $V_3$, connecting the machine reference point $RP_M$ to the workpiece reference point $RP_S$, is determined by operation 42d. Accordingly, operation 42d determines the precise position of the reference point $RP_S$ of the reference mark 34 in terms of the machine coordinates.

The operations illustrated in the flow chart of FIG. 11 are performed separately for each of the two reference marks 34a, 35a, such that the location of each reference mark is determined in terms of the machine coordinates.

The WS processor 15 then determines the geometrical transformations required to transform the workpiece coordinates of the two reference marks 34, 35, to machine coordinates (block 43, FIG. 10). Preferably, these geometrical transformations include scale transformation, rotation transformation, X-axis shift transformation, and Y-axis shift transformation. Following are the calculations of the four geometrical transformations performed in the WS processor, and the order in which they are performed, to transform the reference mark coordinates from the substrate (nominal) to the machine (actual) coordinates.

(1) S=scale, stretching or shrinking the nominal vector;

(2) R=rotation angle in which the nominal vector is rotated;

(3) DX=x-axis (drum circumference) shift of the nominal vector;

(4) DY=y-axis (carriage) shift.

These four numbers are calculated in the WS processor 15 and are sent to the machine processor 16.

The nominal (substrate) coordinates of the two reference marks are: $(x_1^N, y_1^N); (x_2^N, y_2^N)$. The actual coordinates are: $(x_1, y_1); (x_2, y_2)$.

After each of the two transformation is calculated, the transformation is applied on the nominal positions to yield transformed coordinates needed for calculating the next transformation.

(1) Scaling $$S = \frac{|\vec{r}|}{|\vec{r}_N|}, \text{ where: } \begin{aligned} |\vec{r}_N| &= \sqrt{(x_2^N - x_1^N)^2 + (y_2^N - y_1^N)^2}, \\ |\vec{r}| &= \sqrt{(x_2 - x_1)^2 + (y_2 - y_1)^2}. \end{aligned}$$

Then, the new nominal coordinates:

$$x_1^{N1} = S \cdot x_1^N;\ y_1^{N1} = S \cdot y_1^N;\ x_2^{N1} = S \cdot x_2^N;\ y_2^{N1} = S \cdot y_2^N$$

(2) Rotation:

$$R = \cos^{-1}\left[\frac{(x_2 - x_1)(x_2^{N1} - x_1^{N1}) + (y_2 - y_1)(y_2^{N1} - y_1^{N1})}{\sqrt{[(x_2 - x_1)^2 + (y_2 - y_1)^2] \cdot \sqrt{[(x_2^{N1} - x_1^{N1})^2 + (y_1^{N1} - y_1^{N1})^2]}}}\right],$$

and then:

$$x_1^{N2} = x_1^{N1} \cdot \cos(R) - y_1^{N1} \cdot \sin(R)$$
$$y_1^{N2} = x_1^{N1} \cdot \sin(R) + y_1^{N1} \cdot \cos(R)$$
$$x_2^{N2} = x_2^{N1} \cdot \cos(R) - y_2^{N1} \cdot \sin(R)$$
$$y_2^{N2} = x_2^{N1} \cdot \sin(R) + y_2^{N1} \cdot \cos(R)$$

(3) Shift X:

$$DX = \frac{x_1 + x_2}{2} - \frac{x_1^{N2} + x_2^{N2}}{2}$$

(4) Shift Y:

$$DY = \frac{y_1 + y_2}{2} - \frac{y_1^{N2} + y_2^{N2}}{2}$$

The numbers (S,R,DX,DY) are sent to the imager processor 16, which applies them on the electronic image as well known in the art.

It is not necessary to determine and use all the foregoing geometrical transformations, as in some applications it may be sufficient or appropriate to determine and/or use only one (e.g., scaling), two, or three of such transformations.

The processing operation (e.g., imaging, plotting, printing) is now controlled by the image processor 16 in accordance with the determined geometrical transformation or transformations, as indicated by block 44 of FIG. 10. By manipulating the elctronics and data flow, the imager processor 16 is able to apply one or more of the desired geometrical transformations (e.g., shift, scaling and rotation) on the imaged file during imaging, by means well known and commonly used in the existing commercial equipment, such as in the LDI (Laser Direct Imaging) system for imaging printing-press plates produced by Creo Products Inc. of Canada. For example, image scaling may be controlled by changing the data transfer rate to the substrate, and/or by changing the relative velocity between the drum or flat-bed and the writing beams.

The geometrical transformations applied by the imager processor 16 on the electronic image may have any desired algebraic relation to the geometrical transformations determined by the WS processor 15. Preferably, in order to achieve correct image geometry and scale, and later on side to side registration, the same transformations to transform the workpiece coordinates of the reference marks to the machine coordinates are applied on the electronic image during the writing or plotting of the image by the laser printing elements 6 on the respective side of the substrate.

In the example illustrated in FIGS. 7 and 8, images are also to be printed on the opposite side of the substrate, which is the reason why reference marks 34b, 35b, are also applied to the opposite side of the substrate. Accordingly, after one side has been correctly plotted in the manner described above, the substrate is turned over, and the above-described procedure is repeated for plotting on the opposite side, such that the images plotted on both sides are properly registered and scaled with respect to the reference marks, and thereby with respect to each other, and not to the edges of the substrate.

It will also be appreciated that if two (or more) substrates are handled at the same time, as shown in FIG. 2, each substrate will carry its own reference marks, and the above-described procedure will be followed with respect to the reference marks of each substrate.

Preferably, the electronic images are transformed in the above-described manner in real time during the exposing operation, but they may also be transformed off-line before the exposing operation. An advantage of the novel method is that it enables the file to be transformed on-line and in real time during the exposing operation, from one format (e.g., a vector format, such as post-script) to a bit-map format (e.g., rastering), which otherwise would be a time-consuming process. Thus, the format transformation process can be carried out in parallel with the above-described coordinate transformation process, and would thereby save time and increase throughput.

Another advantage in performing geometrical transformations during the imaging or other processing operations is that this allows for real-time corrections and adjustments in the processing operation according to data gathered on-line at that time. For example, if a first processing operation is performed on the substrate (e.g., hole-drilling), and machine errors are introduced in that processing operation, this may result in registration problems with respect to a second processing operation (e.g., imaging a conductor pattern) to be performed on the same substrate and to have a critical relationship with respect to the first processing operation. Even though the conductor pattern file and the drilling file are properly converted to machine coordinates (e.g., as described above), nevertheless an error in the drilling machine when drilling the holes could subsequently affect the critical relationship required between such holes and the conductive patterns (e.g., conductor pads) to be produced in a subsequent imaging operation.

A similar registration problem may arise if other processing steps are applied on the substrate between the first and second processes in which the substrate may experience dimensional and/or geometrical changes, or due to temperature changes between the first and second processes. In the example of PCB inner-layer drilling and imaging, such intermediate processing steps may include resist-coating, copper etching, lamination, multi-layer casting, etc.

Figure 13:
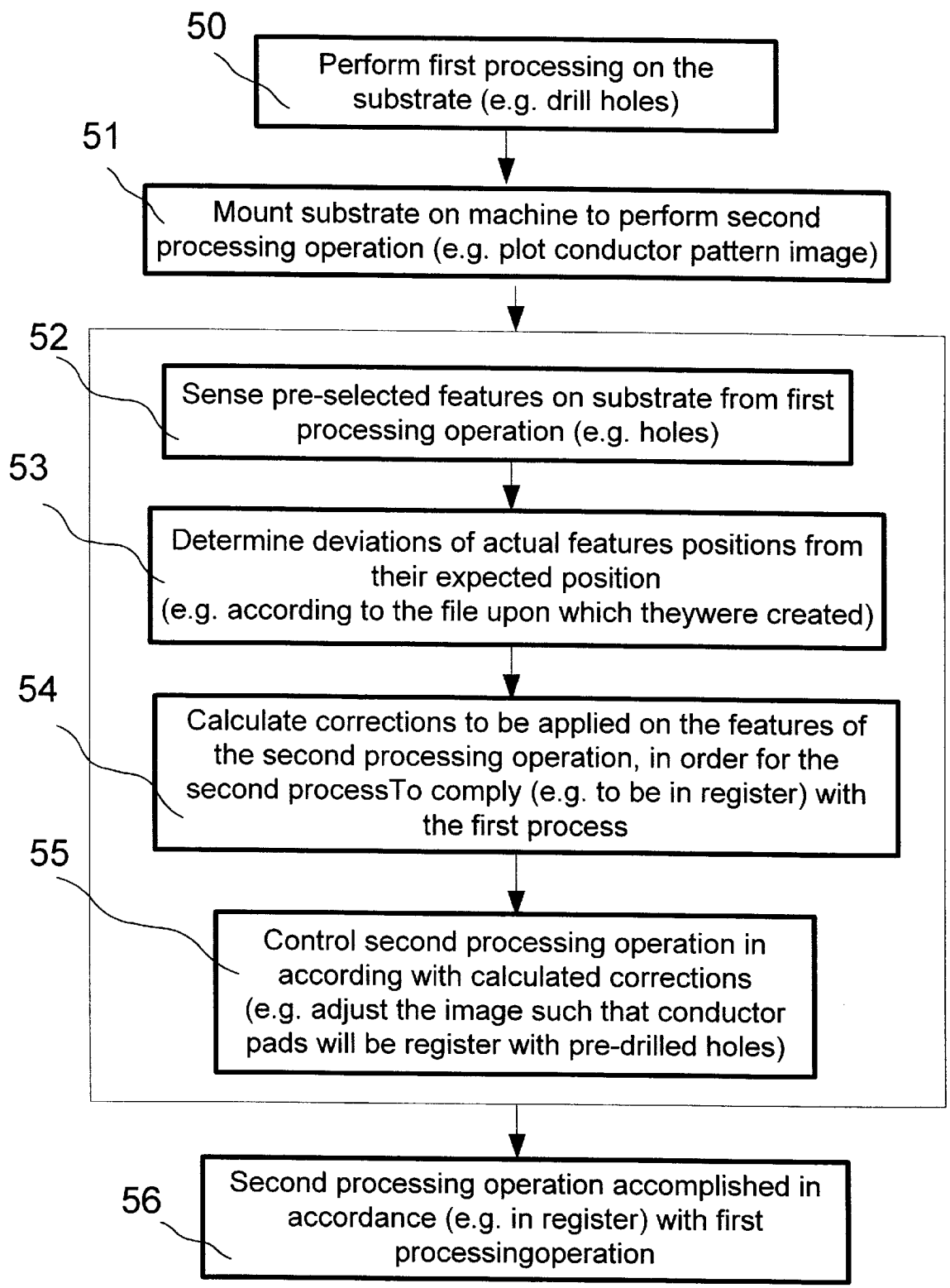
FIG. 13 is a flow chart illustrating another method of reducing or eliminating registration errors in accordance with another aspect of the present invention.

FIG. 13 is a flow chart illustrating a method particularly addressing the foregoing registration problems. Thus, as shown in FIG. 13, the first processing operation is performed on the substrate (block 50); the substrate is mounted on the machine to perform the second processing operation (block 51); and as the second processing operation progresses, preselected features on the substrate from the first processing operation are sensed (block 52) and used to control the second processing operation (blocks 53–55). The sequence of identifying features from the first process, comparing their positions with their anticipated positions (e.g., their coordinates in a suitable file transformed to machine coordinates), and controlling the second operation in accordance with deviations of these features from their anticipated positions, is performed repeatedly during the second operation, until the second operation is accomplished in accordance with the first operation (block 56). Being suitably controlled, the second process follows the path of the features of the first process in real-time, resulting in registration between related features of the first and second processes.

Figure 14:
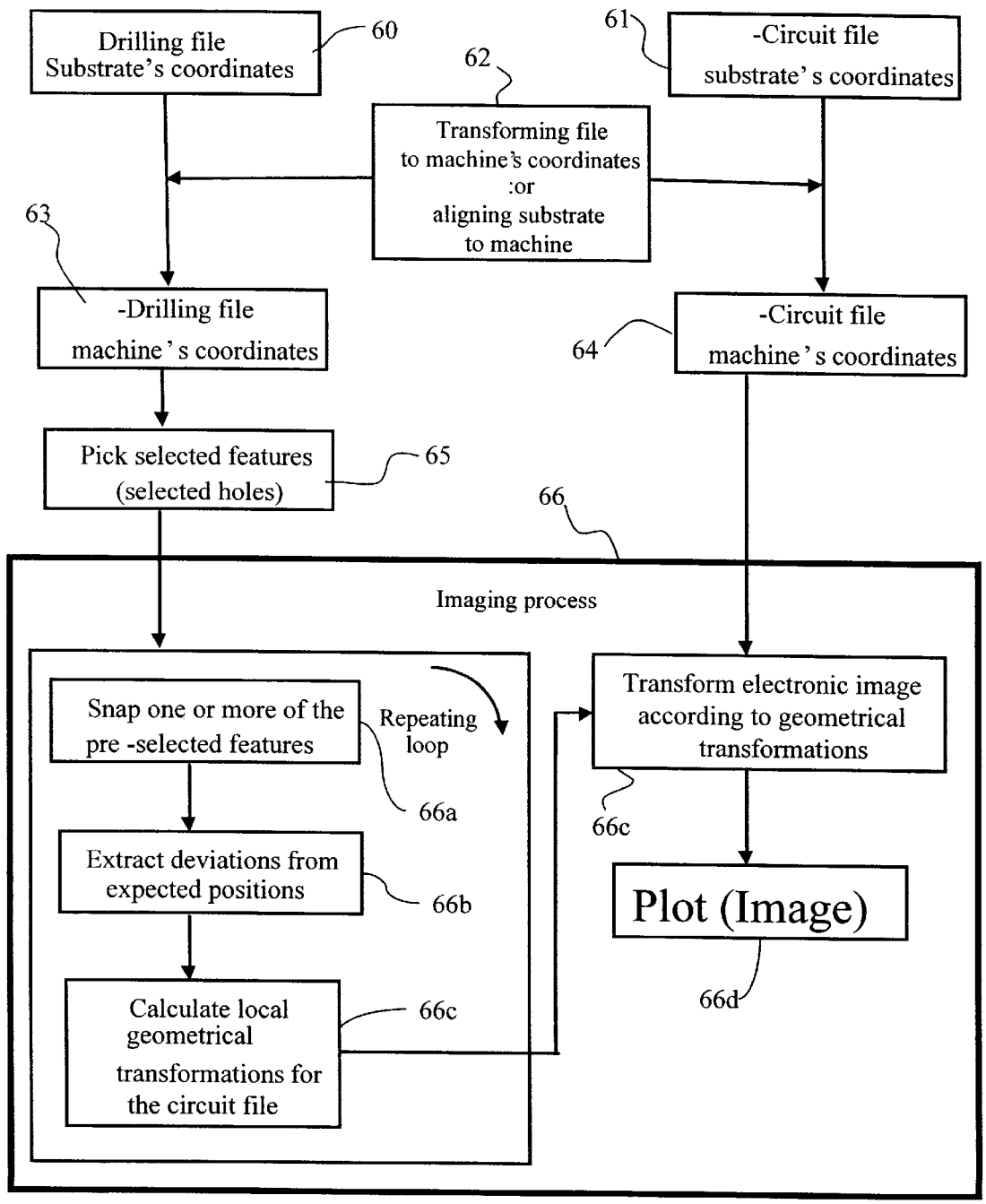
FIG. 14 is a flow chart illustrating one implementation of the method of FIG. 13.

FIG. 14 illustrates a specific implementation of FIG. 13 wherein the first processing operation of block 50 is the drilling of holes; and the second processing operation of blocks 52–56 is plotting an image on an etch resist coating for producing conductive pathways including pads.

Thus, as shown in FIG. 14, the original drilling file is in substrate coordinates (block 60), and the original circuit file is also in substrate coordinates (block 61). As shown by block 62, these coordinates may be transformed to machine coordinates in the electronic manner described above for transforming the electronic image of each file, using the at least two reference marks applied to the substrate; alternatively, the substrate may merely be aligned to the machine using other techniques, such as one of the prior art techniques for physically re-orienting the substrate to the machine coordinates after the substrate has been applied to the machine.

The drilling file is then executed based on the machine coordinates (block 63); and the circuit file is executed based on the machine coordinates (block 64). The execution of the circuit file is controlled by selecting features (holes) on the substrate produced by the drilling file, as shown by block 65, in accordance with the imaging process indicated by the large block 66.

This imaging process of block 66 thus includes snapping one or more of the preselected features, e.g., the holes, (block 66a), extracting deviations from the expected positions by comparing the actual, sensed positions with the nominal positions (block 66b), calculating the local geometric transformations to correct for these deviations (block 66c), and using the calculated local geometrical transformations for transforming the electronic image from the circuit file (block 64) during the plotting of the image of the circuit file (block 66e). Accordingly, the plotting of the image from the circuit file, and particularly the image of the conductive pads of the circuit file, will be assured of having the proper critical relationship required with respect to the holes produced during the previous execution of the drilling file.

FIG. 14 also more particularly shows the repeated loop of blocks 52–55 in FIG. 13 after the first processing operation (drilling of holes) has been performed, and the substrate has been loaded on the imager to perform the second processing operation (plotting the image on the etch-resist coating).

Figure 15:
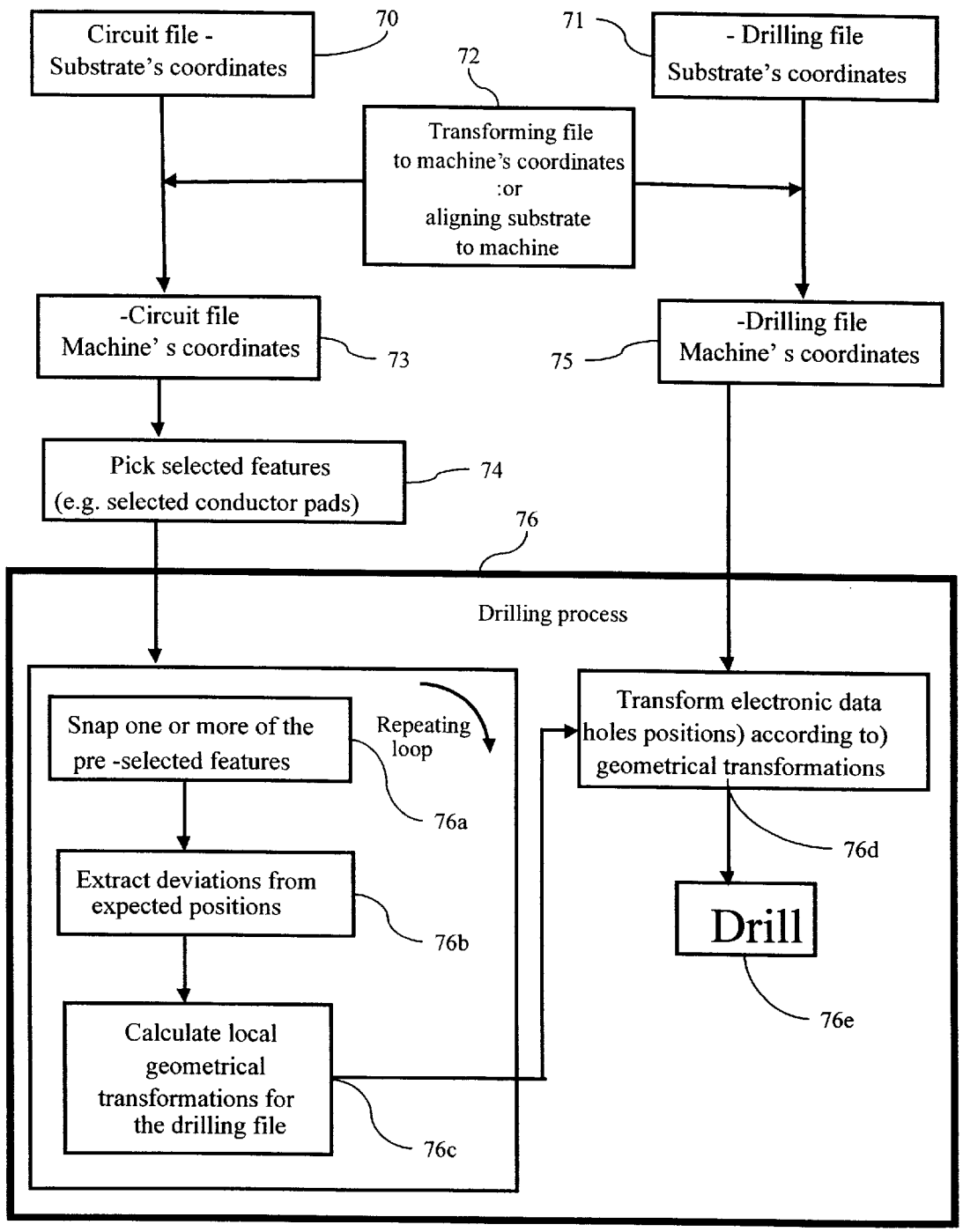
FIG. 15 is a flow chart illustrating an alternative implementation of the method of FIG. 13.

FIG. 15 is a flow chart corresponding to that of FIG. 14, but illustrating the process wherein the first processing operation is the plotting of the image on the etch-resist coating for producing conductive pathways including pads; and the second processing operation is the drilling of holes which is controlled by the pad features sensed after the substrate has been loaded onto the drilling machine. Thus, blocks 70–75 correspond to blocks 60–65 in FIG. 14, except the first processing operation is to execute the circuit file, and the second processing operation is to execute the drilling file; and blocks 76a–76e within large block 76 illustrate how the execution of the drilling file is controlled by selecting features (e.g., pads) produced during the previous execution of the circuit file, to assure that the drilled holes will have the required critical relationship with respect to the pads.

Although it is preferred from throughput considerations that the identification of features from the first process and the realted control of the second process be carried out in real-time, all the preselected features from the first process can be identified first, and then the file of the second process can be modified accordingly off-line. The second process would then be performed upon the modified file. This option may be preferable, for example, where not all the desired transformations can be performed in real-time.

It is also optional, in such case, that the machine which identifies the features of the first process need not be the machine which performs the second process. In this case, the features would be identified prior to loading the substrate on the machine which performs the second operation.

In addition to avoiding registration problems because of errors caused during a prior processing operation as described above with respect to FIGS. 13–15, the novel method also enables other changes to be made in real-time (or off-line) with the performance of an imaging operation, or other processing operation. For example, as indicated earlier the pixal incremental positions along the drum axis may be changed to change the scaling along the drum axis. This may be done in real time by changing data transfer rates to the substrate (pixal data stroke frequency) and/or by changing the drum (or flat bed) velocity. Such features provide a number of advantages including: extreme accuracy; the ability to address in a sub-micron level far beyond the pixal size; the ability to make on-line changes in scaling by changing carriage speed; and the ability to change plot start positions along the drum axis as plot progresses, to make jumps in the positions in the memory buffer from which data is taken for the strokes, and to achieve a relative shift of the image along the carriage axis between several imaged layers by taking the data from various images and from different locations in the same memory buffer.

Figure 16:
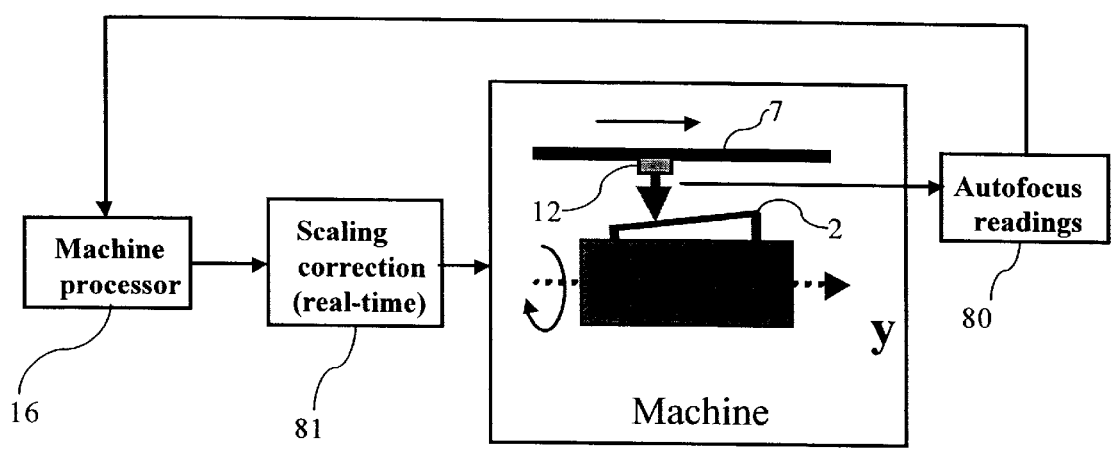
FIG. 16 is a diagram illustrating another manner for eliminating or reducing registration problems arising from variations in the thickness of the substrate.

Another type of scaling correction that may be made in real time with the processing operation is one to compensate for geometrical changes due to deviations in the thickness of the substrate. This is shown schematically in the diagram of FIG. 16, wherein it will be seen that the autofocus device 12 (or 112, FIG. 9), in automatically focussing the lasers 6 (or laser 106) on the surface of the substrate 2 (or 102) to receive the printed image, also produces a measurement of the thickness of the substrate. The autofocus thickness readings (block 80) are extracted and continuously sent to the machine processor 16 in real-time. The processor translates the thickness deviations to scaling corrections (block 81) in real time, and compensates accordingly in its control of the printing lasers.

While the invention has been described with respect to preferred embodiments, it will be appreciated that these are set forth merely for purpose of example, and that many other variations and applications of the invention may be made. For example, the invention could be applied to working operations other than printing, e.g., punching, drilling or cutting workpieces. The invention could also be applied to internal rotary-drum plotters as well as external rotary-drum plotters, and also to X-ray plotters for sensing embedded features. In addition, instead of specially applying the sensible reference marks, reference points on features applied to the workpiece (e.g., substrate) in accordance with the respective working (e.g., printing) file could be used as the reference marks or features since their nominal (actual) locations are already known in terms of the coordinance of the respective workpiece from the respective working file. In addition, various sensing devices (e.g., electrical, magnetic, mechanical, X-ray camera or other optical devices) could be used for sensing the reference marks or the reference features.

Many other variations, modifications and applications of the invention will be apparent.

What is claimed is:

1. A method of controlling a processing machine to perform a processing operation on a workpiece, comprising the following steps:
    (a) determining the nominal locations of at least two sensible reference marks on said workpiece in terms of the coordinates of the workpiece;
    (b) mounting the workpiece on the processing machine;
    (c) sensing, and measuring the actual locations of, said reference marks on the workpiece when so mounted, in terms of the coordinates of the processing machine;
    (d) determining at least one geometrical transformation needed to transform the workpiece coordinates of the nominal locations of said reference marks to the processing machine coordinates of said actual locations of said reference marks;
    (e) and controlling said processing machine in accordance with said determined geometrical transformation.

2. The method according to claim 1, wherein the actual location of each of the workpiece reference marks is determined in step (c) by; fixing a sensing device to the processing machine for sensing the workpiece reference marks, with a reference point of the sensing device being at a known location with respect to a reference point of the machine; and vectorially adding the line vector from the machine reference point to the sensing device reference point, and the line vector from the sensing device reference point to the respective workpiece reference point.

3. The method according to claim 1, wherein the actual location of each of the workpiece reference marks is measured in step (c) by:
    (i) fixing a camera to the processing machine such that a reference point of the camera field of view is at a known location with respect to a reference point of the machine;
    (ii) actuating the camera to view a portion of the workpiece which includes the respective workpiece reference mark;
    (iii) measuring the location of a reference point on the respective workpiece reference mark in the camera field of view, relative to the camera field reference point;
    (iv) and vectorially adding the line vector from the machine reference point to the camera field reference point, and the line vector from the camera field reference point to the respective workpiece reference point, to thereby determine the location of the respective workpiece reference point relative to the machine reference point.

4. The method according to claim 1, wherein said sensible reference marks of step (a) are made specially on the workpiece at known nominal locations thereon for determining the geometrical transformations to be used in controlling said processing machine.

5. The method according to claim 1, wherein said sensible reference marks of step (a) are marks which exist in known nominal locations on the workpiece in features present on the workpiece.

6. The method according to claim 1, wherein said steps (c)–(e) are performed in real-time for each sensed reference mark.

7. The method according to claim 1, wherein said step (c) includes the determination of scale transformation, rotation transformation, X-axis shift transformation, and Y-axis shift transformation.

8. The method according to claim 1, wherein said workpiece is a substrate, and said processing machine is an imaging machine including a plotting head for producing an image on the face of the substrate in accordance with said steps (a)–(e).

9. The method according to claim 8, wherein said imaging machine includes a rotatable drum on which said substrate is mounted, and said plotting head scans the substrate on the drum along an axis extending parallel to the rotary axis of the drum during the rotation of the drum.

10. The method according to claim 9, wherein said sensible reference marks are located on the substrate at approximately the same axial position of the drum rotary axis and at different circumferencial positions of the drum.

11. The method according to claim 8, wherein said imaging machine includes a flat-bed for mounting said substrate, and a drive for driving said flat-bed along one orthogonal axis; and wherein said plotting head scans the substrate along the other orthogonal axis with respect to the substrate.

12. The method according to claim 1, wherein: said workpiece is a substrate having thickness; said processing operation is an imaging operation performed on a surface of the substrate; and said processing machine continuously measures the thickness of said substrate and continuously controls the imaging operation to compensate for variations in the thickness of the substrate.

13. The method according to claim 1, wherein: said reference marks on the workpiece determined in step (a) relate to features produced on the workpiece in accordance with a first processing operation; and said steps (b), (c), (d) and (e) relate to a second processing operation to be performed on the workpiece subsequently to said first processing operation and to be compensated for inaccuracies produced in said first processing operation.

14. The method according to claim 13, wherein said steps (c)–(e) are performed in real-time for each sensed reference mark.

15. The method according to claim 13, wherein said workpiece is a layer of a printed circuit board, and said first and second processing operations relate to the formation of pads on one face of the layer, and holes through the layer, which pads and holes are to have a predetermined relationship to each other in making the printed circuit board.

16. The method according to claim 15, wherein said first processing operation includes the formation of said holes, and said second processing operation includes the formation of said pads.

17. The method according to claim 15, wherein said first processing operation includes the formation of said pads, and said second processing operation includes the formation of said holes.

18. The method according to claim 1, wherein said reference marks are made by a marking device which includes a table having a support for receiving the workpiece and for moving it along the table; a stop for stopping the workpiece at a predetermined position; and a marking implement for applying said two reference marks on the workpiece when in said predetermined position.

19. The method according to claim 18, wherein said marking implement simultaneously applies said two reference marks on opposite faces of said workpiece.

20. A method of controlling the imaging operation of an imaging machine for producing an image on a substrate according to an image file, comprising the following steps:

(a) determining the nominal locations of at least two sensible reference marks on said substrate in terms of the coordinates of the substrate;

(b) mounting the substrate on the imaging machine having a plotting head;

(c) sensing, and measuring the actual locations of, said reference marks on the mounted substrate in terms of the coordinates of the imaging machine;

(d) determining at least one geometrical transformation needed to transform the substrate coordinates of the nominal locations of said reference marks to the imaging machine coordinates of the sensed locations of said reference marks;

(e) and controlling said plotting head to produce an image on said substrate in accordance with the determined geometrical transformation.

21. The method according to claim 20, wherein the actual location of each of the workpiece reference marks is determined in step (c) by; fixing a sensing device to the imaging machine for sensing the workpiece reference marks, with a reference point of the sensing device being at a known location with respect to a reference point of the machine; and vectorially adding the line vector from the machine reference point to the sensing device reference point, and the line vector from the sensing device reference point to the respective workpiece reference point.

22. The method according to claim 20, wherein the actual location of each of the substrate reference marks is measured in step (c) by:

(i) fixing a camera to the imagng machine such that a reference point of the camera field of view is at a known location with respect to a reference point of the machine;

(ii) actuating the camera to view a portion of the substrate which includes the respective substrate reference mark;

(iii) measuring the location of a reference point on the respective substrate reference mark in the camera field of view, relative to the camera field reference point;

(iv) and vectorially adding the line vector from the machine reference point to the camera field reference point, and the line vector from the camera field reference point to the respective substrate reference point, to thereby determine the location of the respective sunstrate reference point relative to the machine reference point.

23. The method according to claim 20, wherein said sensible reference marks of step (a) are made specially on the substrate at known nominal locations thereon for determining the geometrical transformations to be used in controlling said imaging operation.

24. The method according to claim 20, wherein said sensible reference marks of step (a) are marks which exist in known nominal locations on the substrate in features present on the substrate.

25. The method according to claim 20, wherein said steps (c)–(e) are performed in real-time for each sensed reference mark.

26. The method according to claim 20, wherein said step (d) includes the determination of scale transformation, rotation transformation, X-axis shift transformation, and Y-axis shift transformation.

27. The method according to claim 20, wherein said substrate has two sides on each of which an image is to be produced from a respective image file in accordance with said steps (a)–(e).

28. The method according to claim 20, wherein said substrate is mounted on a rotatable drum of the imaging machine; and said plotting head scans the substrate on the drum along an axis parallel to the rotary axis of the drum.

29. The method according to claim 28, wherein said sensible reference marks are located on the substrate at approximately the same axial position of the drum rotary axis and at different circumferential positions of the drum.

30. The method according to claim 20, wherein said substrate is mounted on a flat-bed driven along one orthogonal axis, and said plotting head scans the substrate along the other orthogonal axis.

31. The method according to claim 20, wherein said plotting head includes an array of plotting elements.

32. The method according to claim 20, wherein said imaging machine further includes a device continuously measuring the thickness of the substrate and continuously controlling said plotting head to compensate for variations in the thickness of the substrate.

33. The method according to claim 20, wherein, said reference marks on the substrate of step (a) relate to features produced on the substrate in accordance with a first processing operation; and said steps (b), (c), (d) and (e) relate to a second processing operation to be performed on the substrate subsequently to said first processing operation and to be compensated for inaccuracies produced in said first processing operation.

34. The method according to claim 33 wherein said steps (c)–(e) are performed in real-time for each sensed reference mark.

35. The method according to claim 33, wherein said sequence of steps (c)–(e) is performed repeatedly, during the second processing operation, each sequence performed for a portion of said reference marks.

36. The method according to claim 33, wherein said substrate is a layer of a printed circuit board, and said first and second processing operations relate to the formation of pads on one face of the layer, and holes through the layer, which pads and holes are to have a predetermined relationship to each other in the printed circuit board.

37. The method according to claim 36, wherein said first processing operation includes the formation of said holes, and said second processing operation includes the formation of said pads.

38. The method according to claim 36, wherein said first processing operation includes the formation of said pads, and said second processing operation includes the formation of said holes.

39. Apparatus for controlling a processing operation on a workpiece carrying sensible reference marks at nominal locations on the workpiece in terms of the coordinates of the workpiece, comprising:
   a mounting device for mounting the workpiece to the apparatus;
   a processing head movable with respect to a workpiece when mounted on said mounting device;
   a sensing device carried by said processing head so as to move therewith with respect to a mounted workpiece, said sensing device being capable of sensing said workpiece reference marks and having a reference point which is at a known location with respect to a reference point on the processing head; and
   a data processor system processing the output of said sensing device for:
      (a) determining the locations of said reference marks on the workpiece in terms of the coordinates of the processing head;
      (b) determining the geometrical transformations needed to transform the workpiece coordinates of the nominal locations of said reference marks to said processing head coordinates of the sensed locations of said reference marks; and
      (c) controlling said processing operation in accordance with at least one of said geometrical transformations.

40. The apparatus according to claim 39, wherein said sensing device is a camera carried by said processing head so as to move therewith with respect to a mounted workpiece, said camera having a field of view for covering a portion of the workpiece carrying one of said sensible reference marks, the camera field of view having a reference point which is at a known location with respect to said reference point on the processing head.

41. The apparatus according to claim 39, wherein said processing operation is an imaging operation, said workpiece is a substrate, and said processing head is a plotting head for plotting an image on the substrate.

42. The apparatus according to claim 41, wherein said mounting device is a rotatable drum on which the substrate is to be mounted.

43. The apparatus according to claim 41, wherein said mounting device is a flat-bed.

44. The apparatus according to claim 41, wherein said plotting head further includes a thickness measuring device for measuring the thickness of the substrate mounted on said mounting device, said data processor controlling said imaging operation also in response to variations in the measured thickness of the substrate.

45. The apparatus according to claim 44, wherein said thickness measuring device is an autofocus device.

46. The apparatus according to claim 41, wherein said data processor system includes a data buffer for storing data for controlling said plotting head which data buffer is controlled in a real-time manner during the imaging operation in accordance with at least one of said geometrical transformations.

47. The apparatus according to claim 41, wherein said plotting head includes an array of plotting elements extending along one orthogonal axis of the substrate, said mounting device moving the substrate along the other orthogonal axis of the substrate.

48. The apparatus according to claim 47, wherein said plotting elements are lasers.

* * * * *